(12) United States Patent
Matsui

(10) Patent No.: US 6,835,120 B1
(45) Date of Patent: Dec. 28, 2004

(54) METHOD AND APPARATUS FOR MECHANOCHEMICAL POLISHING

(75) Inventor: Masaki Matsui, Nagoya (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/709,454

(22) Filed: Nov. 13, 2000

(30) Foreign Application Priority Data

Nov. 16, 1999 (JP) .............................. 11-325437
Aug. 29, 2000 (JP) ........................ 2000-259116

(51) Int. Cl.$^7$ .......................... B24B 1/00; B24B 57/00
(52) U.S. Cl. ......................... 451/41; 451/53; 451/446; 451/60
(58) Field of Search ................. 451/41, 53, 60, 451/36, 446

(56) References Cited

U.S. PATENT DOCUMENTS

| | | | |
|---|---|---|---|
| 4,343,116 A | * 8/1982 | Murphy et al. ............... 451/42 |
| 5,554,064 A | * 9/1996 | Breivogel et al. ............ 451/41 |
| 5,674,107 A | * 10/1997 | Graebner et al. ............ 451/28 |
| 5,679,063 A | * 10/1997 | Kimura et al. .............. 451/287 |
| 5,725,420 A | * 3/1998 | Torii ........................... 451/285 |
| 5,750,434 A | 5/1998 | Urushidani et al. |
| 5,762,537 A | * 6/1998 | Sandhu et al. ................. 451/7 |
| 5,800,577 A | 9/1998 | Kido |
| 5,816,900 A | * 10/1998 | Nagahara et al. ........... 451/285 |
| 5,853,317 A | * 12/1998 | Yamamoto .................. 451/288 |
| 5,931,718 A | * 8/1999 | Komanduri et al. .......... 451/36 |
| 5,997,392 A | * 12/1999 | Chamberlin et al. ........ 451/446 |
| 6,012,966 A | * 1/2000 | Ban et al. ....................... 451/8 |
| 6,012,967 A | * 1/2000 | Satake et al. ................ 451/41 |
| 6,077,151 A | * 6/2000 | Black et al. .................. 451/53 |
| 6,149,500 A | * 11/2000 | Takahashi et al. ........... 451/41 |
| 6,183,351 B1 | * 2/2001 | Aoki ........................... 451/60 |
| 6,270,395 B1 | * 8/2001 | Towery et al. ............... 451/41 |
| 6,293,851 B1 | * 9/2001 | Molnar ....................... 451/41 |

FOREIGN PATENT DOCUMENTS

| | | |
|---|---|---|
| EP | 664540 | 12/1994 |
| JP | 56-23746 | 6/1981 |
| JP | 7-80770 | 3/1995 |
| JP | 7-288243 | 10/1995 |
| JP | 8-22503 | 3/1996 |

OTHER PUBLICATIONS

Kikuchi et al., "Mechanochemical Polishing of Silicon Carbide Single Crystal with Chromium(III) Oxide Abrasive", *J. Am. Ceram. Soc.*, 75 [1], pp. 189–194 (1992) (Note: This article is discussed at p. 4 of the specification).

* cited by examiner

*Primary Examiner*—Hadi Shakeri
(74) *Attorney, Agent, or Firm*—Posz & Bethards, PLC

(57) ABSTRACT

In a mechanochemical polishing apparatus, a SiC wafer is held on a wafer holding table. The surface of the wafer to be polished is pressed against a polishing cloth applied to a polishing platen with a predetermined processing pressure. The wafer holding table and polishing platen are then rotated to perform polishing with chemical liquid dropped on the polishing cloth. The chemical liquid includes chromium (III) oxide as abrasive grains and hydrogen peroxide water (oxidizing agent) for improving polishing efficiency.

17 Claims, 11 Drawing Sheets

METHOD AND APPARATUS FOR MECHANOCHEMICAL POLISHING

CROSS REFERENCE TO RELATED APPLICATIONS

This application is based upon and claims the benefit of Japanese Patent Applications No. 11-325473 filed on Nov. 16, 1999, and No. 2000-259116 filed on Aug. 29, 2000, the contents of which are incorporated herein by reference.

BACKGROUND OF THE INVENTION

1. Field of the Invention

The present invention relates to mechanochemical polishing and more particularly, to a polishing technique utilizing chromium (III) oxide ($Cr_2O_3$) as abrasive grains.

2. Description of the Related Art

A power semiconductor device formed from a silicon carbide (SiC) having solid state properties with higher values compared to those of silicon (Si) has better performance than a power semiconductor device made of Si. Specifically, a SiC power semiconductor device can function as a semiconductor at high temperature because of its wide energy gap (which is about three times larger than that of Si), can withstand high voltage because of its high dielectric breakdown withstand voltage (which is ten times larger than that of Si), and can accommodate higher current because of excellent radiating properties attributable to its high coefficient of thermal conductivity (which is about three times larger than that of Si).

More specifically, for example, as shown in FIG. 22 a SiC wafer used to form an element is provided by epitaxially growing a SiC layer 101 having a low impurity concentration on a single crystal SiC substrate 100 having a high impurity concentration. An element 103 of a type that causes a current to flow in the longitudinal direction thereof (e.g., VDMOS) is formed on the SiC layer 101. While studies are being made on GaN as a material capable of emitting light having a short wavelength in the field of optical devices, SiC wafers are attracting attention as underlying substrates on which a GaN thin film is to be formed because Sic has less lattice mismatches with GaN compared to sapphire.

An SiC wafer is obtained by growing bulk single crystal SiC by sublimating SiC powder and re-crystallizing it on a seed crystal, cutting the bulk single crystal SiC into a configuration of a wafer and performing mirror finishing on a surface (cut surface) of the wafer. While a Sic layer or a GaN layer is epitaxially grown on the surface, the surface must be free of detects and must be smooth on the, level of atoms in order to obtain the epitaxial layer with high crystallinity.

A common method for mirror finishing of a SiC wafer is to achieve smoothness by polishing the surface using diamond abrasive grains. This is a method for mechanical surface finishing in which the surface of SiC (material to be polished) is polished using abrasive grains made of a material (diamond) harder than the surface. Although a smaller abrasive grain size results in a smoother surface (improved surface roughness), it cannot prevent the occurrence of defects (process-affected layer) originating from processing. Therefore, in this case, polishing is followed by a process for removing any process-affected layer as a post process such as dry etching or wet etching using hydrofluoric acid that is performed after growing an oxide film through thermal oxidation.

Further, diamond abrasive grains are expensive and become more expensive as the grain size is increased. Furthermore, when large abrasive grains are mixed in microscopic abrasive grains, surface roughness is not improved, and scratches may be produced to cause local deep defects. This results in a need for using high quality diamond abrasive grains with a uniform grain size, which also leads to an increase in the cost of abrasive grains. Process control (control of the abrasive grain size) is also difficult.

In a case of polishing using abrasive grains made of a material whose hardness is lower than a material to be polished, the processing can be performed with less damage on a processed surface. In this case, however, it is not possible to perform mechanical polishing in which the abrasive grains directly polish the material to be polished. It is preferable to adapt a polishing method in which a mechanically fragile reaction product (an oxide, compound or the like) is formed on the surface of the material to be polished and is peed off with soft abrasive grains, i.e., so-called mechanochemical polishing (chemical mechanical polishing; MCP). It is however difficult to form a reaction product on SiC because SiC is a chemically stable material.

With respect to mechanochemical polishing methods for SiC, there is a report on a method for polishing SiC using chromium oxide as abrasive grains (M. Kikuchi, Y. Takahashi, T. Suga, S. Suzuki, and Y. Bando, "Mechanochemical Polishing of Silicon Carbide Single Crystal with Chromium (III) Oxide Abrasive", J. Am. Ceram. Soc., 75[1] (1992) 189). According to the report, polishing (MCP) can be achieved without residual distortion and scratches by performing dry polishing of SiC on a disk (fixed abrasive grains) that is obtained by fixing chromium oxide abrasive grains with resin.

Further, Japanese Patent Laid-Open No. 7-80770 proposes a method in which surface flatness of SiC is improved by using chromium oxide power that is free abrasive grains, and a polishing platen made of a material having micro-Vicker's hardness in the range from 1000 to 2000. Those methods are polishing methods that rely upon a mechanochemical phenomenon at contact points between a material to be polished and abrasive grains, and remove a reaction layer produced as a result of a direct solid phase reaction between them by a frictional action of the abrasive grains.

Such method utilizing a solid phase reaction was proposed in Japanese Patent Publication No. 56-23746, and the above-mentioned "Mechanochemical Polishing of Silicon Carbide Single Crystal with Chromium (III) Oxide Abrasive" and Japanese Patent Laid-Open No. 7-80770 are based on a combination of SiC as a material to be polished and a chromium oxide as abrasive grains.

However, in order to cause the solid phase reaction, it is assumed that it is important to put the material to be polished and abrasive grains in contact with each other with a very high pressure at the contact points between them. Referring to the processing pressure, experiments were conducted under pressures of 0.34 MPa (3.5 $kgf/cm^2$) in the above-mentioned "Mechanochemical Polishing of Silicon Carbide Single Crystal with Chromium (III) Oxide Abrasive", and under pressure of 900 $kgf/cm^2$ in Japanese Patent Laid-Open No. 7-80770. When a high processing pressure is required and a wafer with a large diameter is polished, a polishing platen will be subjected to a very high pressure during polishing of the wafer. When several wafers are polished on the same polishing platen, a still higher pressure will be applied to the platen. Therefore, a polishing apparatus is required to have higher rigidity that is not experienced in the prior art.

Further, the processing pressure acts not only on a surface of a SiC wafer as contact points with abrasive grains but also on the wafer as a whole, which results in problems such as the occurrence of crystal distortion and defects, and the progress of existing defects. Furthermore, if uneven force is applied, the wafer might be cracked. On the other hand, when the processing pressures is low, no solid phase reaction occurs and the polishing time is prolonged by a low reaction speed or a low polishing speed even when a reaction occurs.

SUMMARY OF THE INVENTION

The present invention has been made under such limitations, and an object of the present invention is to provide a method and an apparatus for mechanochemical polishing, which make it possible to efficiently polish a hard material such as SiC at a low processing pressure.

According to the present invention, briefly, when a surface of a semiconductor wafer is polished using abrasive grains made of chromium (III) oxide, an oxidizing agent is supplied to exist on the surface of the semiconductor wafer to be polished. The abrasive grains made of chromium (III) oxide naturally serve as a catalyst for forming an oxide on the surface of the semiconductor wafer (for example, SiC), and the oxidizing agent further increases an amount of oxygen that reacts with the semiconductor wafer. As a result, polishing efficiency is improved. A hard material such as SiC can be polished efficiently even at a low processing pressure.

BRIEF DESCRIPTION OF THE DRAWINGS

Other objects and features of the present invention will become more readily apparent from a better understanding of the preferred embodiments described below with reference to the following drawings, in which.

DETAILED DESCRIPTION OF THE PREFERRED EMBODIMENTS (First Embodiment)

A first preferred embodiment of the invention will now be described with reference to the drawings.

Figure 1:
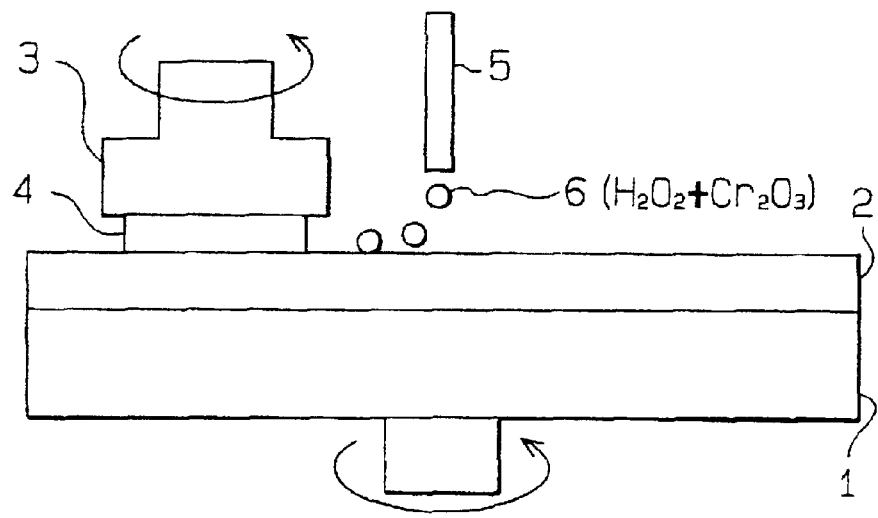
FIG. 1 is a schematic view showing a mechanochemical polishing apparatus in a first preferred embodiment of the invention.

FIG. 1 is a schematic configuration diagram of a mechanochemical polishing apparatus according to the first embodiment. A polishing cloth 2 is applied to a polishing platen 1. Foamed polyurethane, unwoven fabric, felt, suede or the like is used as the polishing cloth 2. A wafer holding table 3 is provided above the polishing platen 1, and a SiC wafer 4 can be held on the wafer holding table 3. During processing, the wafer holding table 3 is pressed against the polishing cloth 2 to press a surface of the SiC wafer 4 to be polished against the same with a predetermined processing pressure. The wafer holding table 3 and polishing platen 1 can be rotated.

Further, an injector (nozzle) 5 is provided above the polishing platen 1, and chemical liquid 6 is dropped on the polishing cloth 2 from the injector 5. The chemical liquid 6 is obtained by dispersing abrasive grains made of chromium (III) oxide in hydrogen peroxide water (oxidizing chemical liquid). That is, a mixture of chromium oxide abrasive grains and oxidizing chemical liquid is used as the chemical liquid slurry 6.

Thus, when the single crystal SiC wafer (semiconductor wafer) 4 is polished by pressing it against the polishing cloth 2 and by using powder of chromium (III) oxide as abrasive grains, hydrogen peroxide water that oxidizing chemical liquid is dropped on the polishing cloth 2 from the injector 5 and accordingly is supplied to the polished surface. Incidentally, the accuracy of processing on the wafer surface and the life of the polishing cloth can be improved by swinging the wafer holding table 3 relative to the polishing platen 1.

A method for mechanochemical polishing will now be described. First, the Sic wafer 4 is held on the wafer holding table 3. Then, the surface to be polished is pressed with a predetermined processing pressure against the polishing cloth 2 applied to the polishing platen 1. Further, the wafer holding table 3 and the polishing platen 1 are rotated to perform polishing with the chemical liquid 6 dropped on the polishing cloth 2.

Hydrogen peroxide water (oxidizing agent) is thus present on the polished surface during polishing, and the hydrogen peroxide water improves polishing efficiency. The improvement of polishing efficiency is considered to be attributable to the fact that the chromium (III) oxide abrasive grains act as a catalyst for forming an oxide on the SiC surface, and the hydrogen peroxide water supplied to the polished surface increases the amount of oxygen reacting with SiC to improve reacting efficiency. It is thus possible to efficiently polish a hard material such as SiC with a low processing pressure.

The minimum pressure to allow polishing is determined by the type of the polishing cloth 2, the concentration and size of the chromium (III) oxide abrasive grains, the concentration and amount of the dropped hydrogen peroxide water, the rotational speeds of the wafer holding table 3 and polishing platen 1, etc.

According to an experiment, surface roughness (average roughness Ra along the center line) of 1.20 nm of a sample could be smoothed to 0.43 nm as a result of polishing for 30 minutes even with a low processing pressure (0.34 kgf/cm$^2$). Referring to the polishing conditions at that time, the polishing cloth was made of foamed polyurethane; the polishing liquid was obtained by dispersing chromium (III) oxide abrasive grains of 0.5 μm in a grain size (at a concentration of 10% by weight) in hydrogen peroxide water (concentration of 10%); the dropped amount of the polishing liquid was 5.0 milliliter/min.; and the rotational speed of the wafer holding table and polishing platen was 40 rpm.

Detailed results of the experiment will now be described with reference to FIGS. 2 through 9.

The experiment was carried out as follows. Single crystal SiC (6H-SiC) was used as a sample, and a (0001) Si-face of the SiC wafer was polished. Referring to the polishing conditions, three types of polishing, i.e., polishing (i) with hydrogen peroxide water (oxidizing agent) dropped as described in the present embodiment, dry polishing (ii) and wet polishing (iii) were conducted for comparison. Specifically, in the polishing (i) with hydrogen peroxide water dropped per, the polishing was performed by dropping the liquid obtained by dispersing chromium (III) oxide abrasive grains (at a concentration of 10% by weight) in hydrogen peroxide water (concentration of 10%) on a polishing cloth. In the dry polishing (ii), the polishing was performed using a polishing cloth having chromium (III) oxide abrasive grains applied thereon. In the wet polishing (iii), the polishing was performed by dropping chromium (III) oxide liquid obtained by dispersing chromium oxide abrasive grains of 10% by weight in water on a polishing cloth.

The evaluation of polishing was made based on changes in surface roughness as time elapsed. Specifically, change in the surface roughness of each sample was examined.

Foamed polyurethane was used for the polishing cloths, and abrasive grains made of chromium (III) oxide with a grain size of 0.5 μm were used. The processing pressure was 3.0 kgf/cm². The surfaces to be polished were surfaces, which were processed by grinding (#8000) and had irregularities (grinding marks) in a predetermined direction cut by a grind wheel made of diamond.

Figure 2:
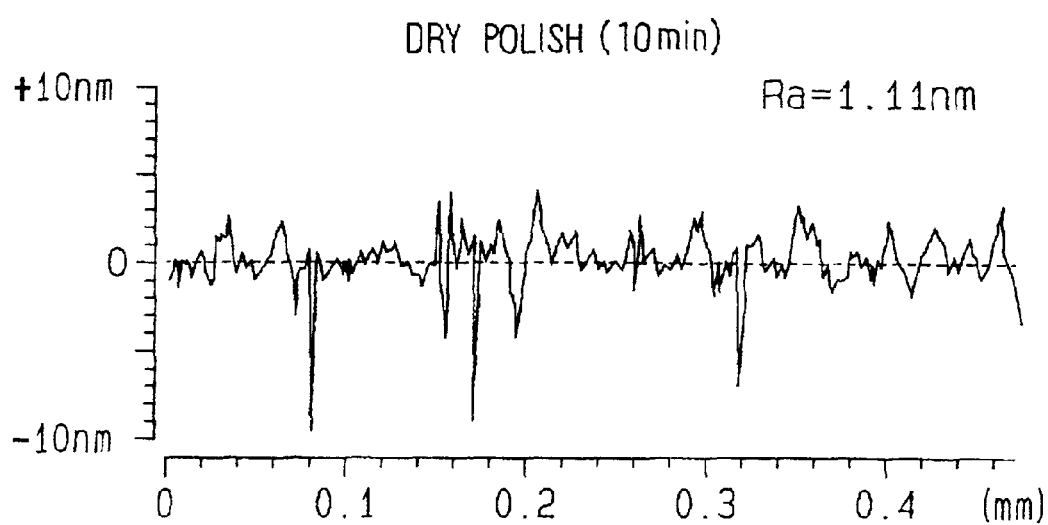
FIG. 2 is a chart showing a change in surface roughness relative to time.
Figure 3:
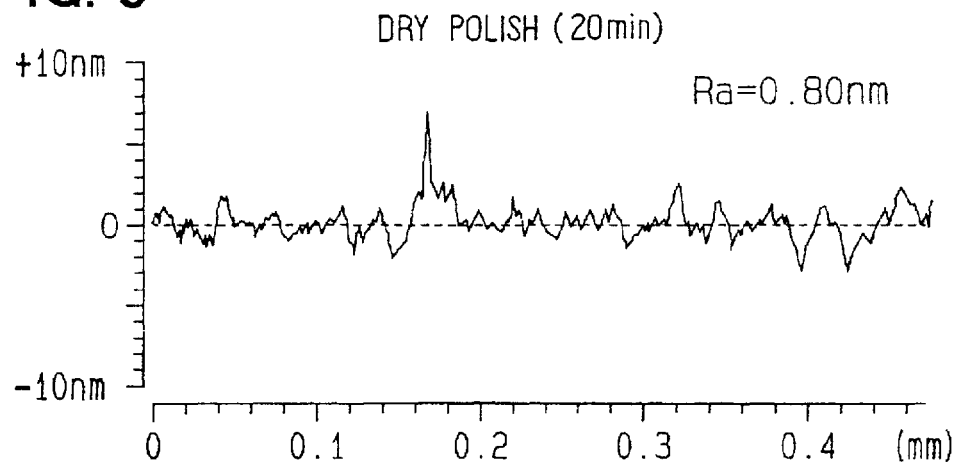
FIG. 3 is a chart showing a change in surface roughness relative to time.
Figure 4:
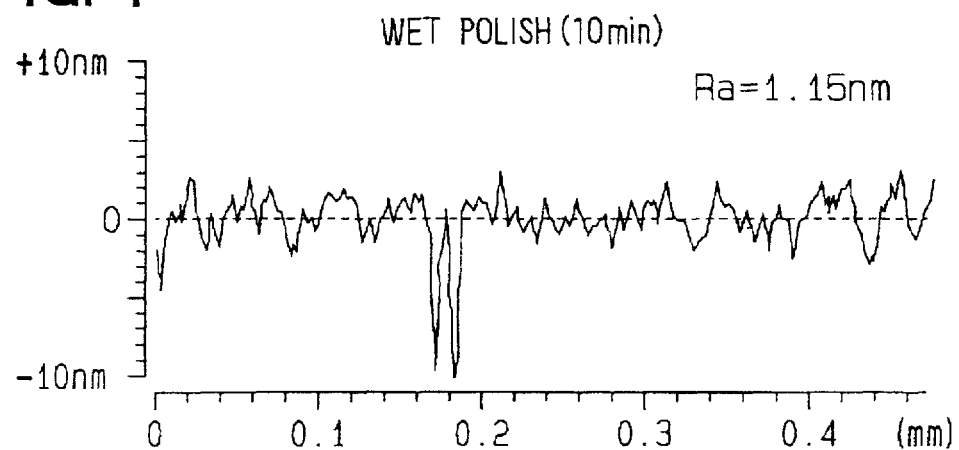
FIG. 4 is a chart showing a change in surface roughness relative to time.
Figure 5:
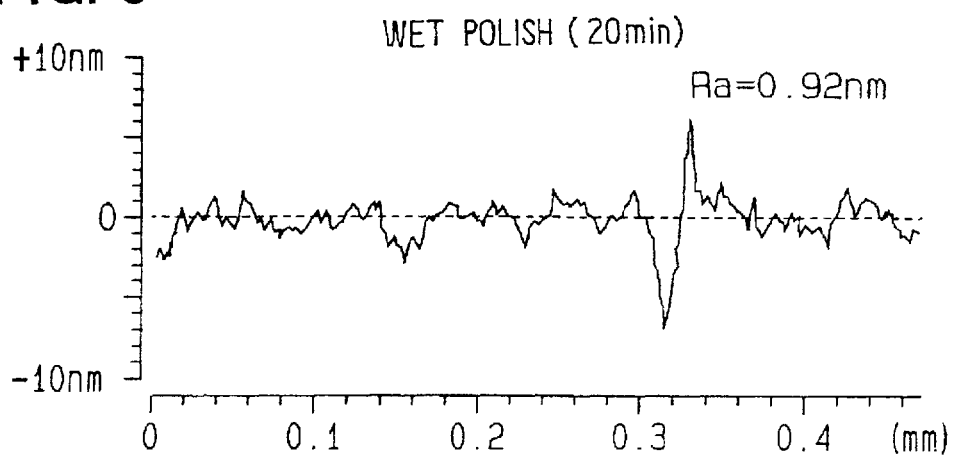
FIG. 5 is a chart showing a change in surface roughness relative to time.

FIG. 2 shows a state of a surface after the dry polishing as described above was performed for 10 minutes. The surface roughness Ra at that time was 1.11 nm. Similarly, FIG. 3 shows a state of a surface after the dry polishing was performed for 20 minutes. The surface roughness Ra at that time was 0.80 nm. FIG. 4 shows a state of a surface after the wet polishing as described above was performed for 10 minutes. The surface roughness Ra at that time was 1.15 nm. Similarly, FIG. 5 shows a state of a surface after the wet polishing was performed for 20 minutes. The surface roughness Ra at that time was 0.92 nm.

Figure 6:
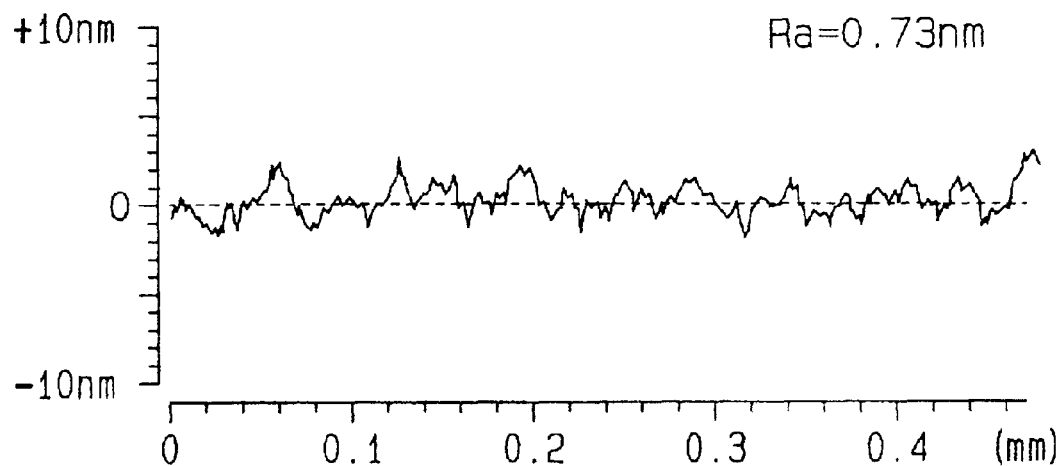
FIG. 6 is a chart showing a change in surface roughness relative to time.
Figure 7:
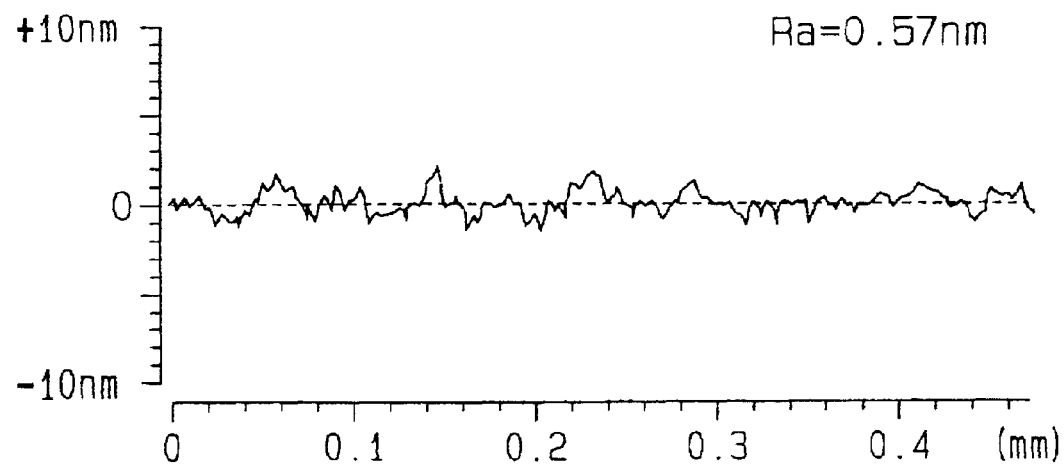
FIG. 7 is a chart showing a change in surface roughness relative to time.

Further, FIG. 6 shows a state of a surface after the polishing was performed while dropping hydrogen peroxide water (oxidizing agent) as described above for 10 minutes. The surface roughness Ra at that time was 0.73 nm. Similarly, FIG. 7 shows a state of a surface after the polishing was performed while dropping hydrogen peroxide water (oxidizing agent) for 20 minutes. The surface roughness Ra at that time was 0.57 nm.

Figure 8:
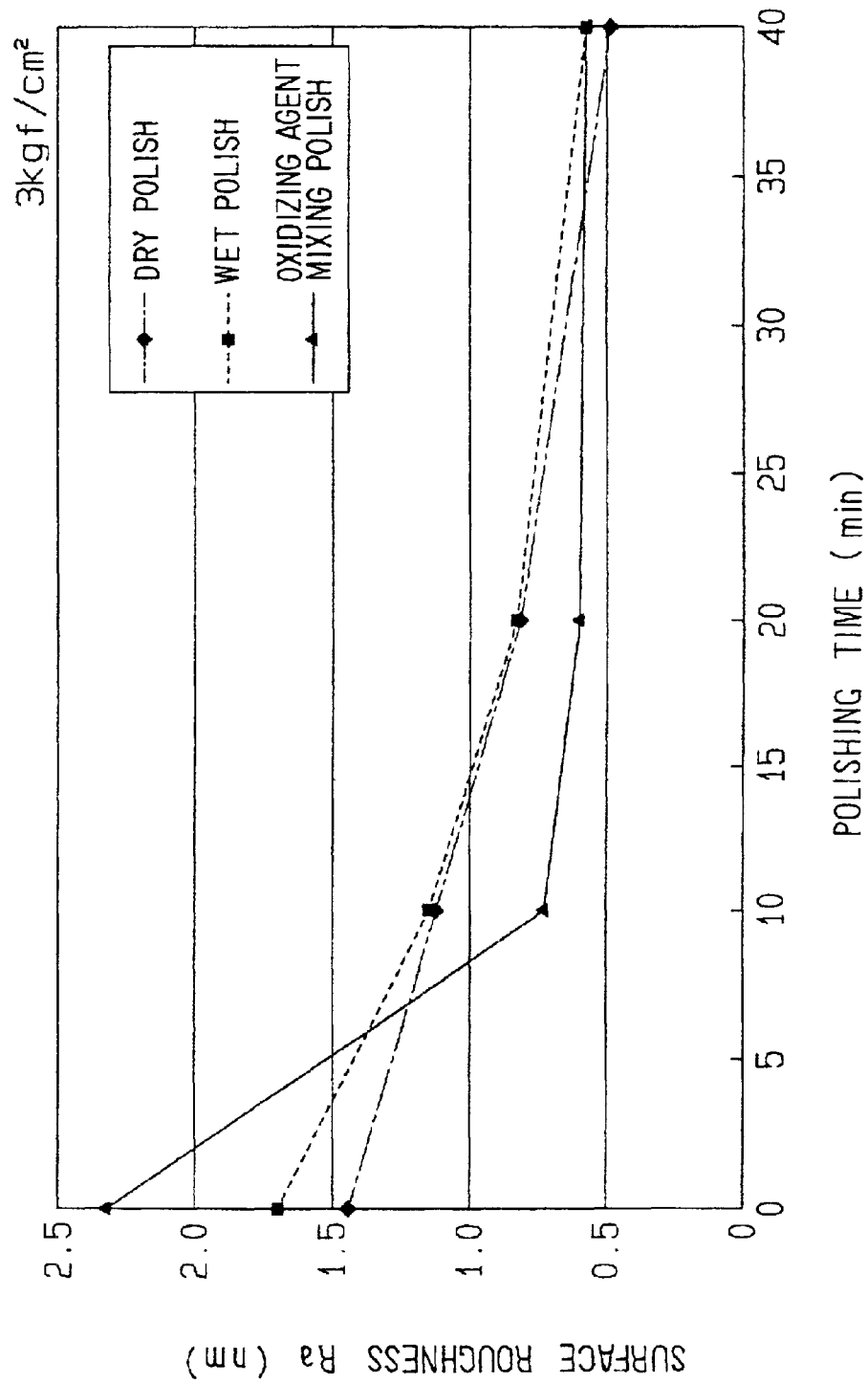
FIG. 8 is a graph showing surface roughness relative to polishing time.

FIG. 8 shows a collection of data thus obtained. Polishing time is plotted along the horizontal axis of FIG. 8, and surface roughness Ra is plotted along the vertical axis. The figure showing changes in surface roughness indicates that surface roughness was improved in a short time under the condition that (in the sample in which) the oxidizing agent- was mixed. When processing was performed for 20 minutes, grinding marks had disappeared only in the case in which the oxidizing agent was mixed. It was thus confirmed that the addition of the oxidizing agent advantageously improves polishing.

Figure 9:
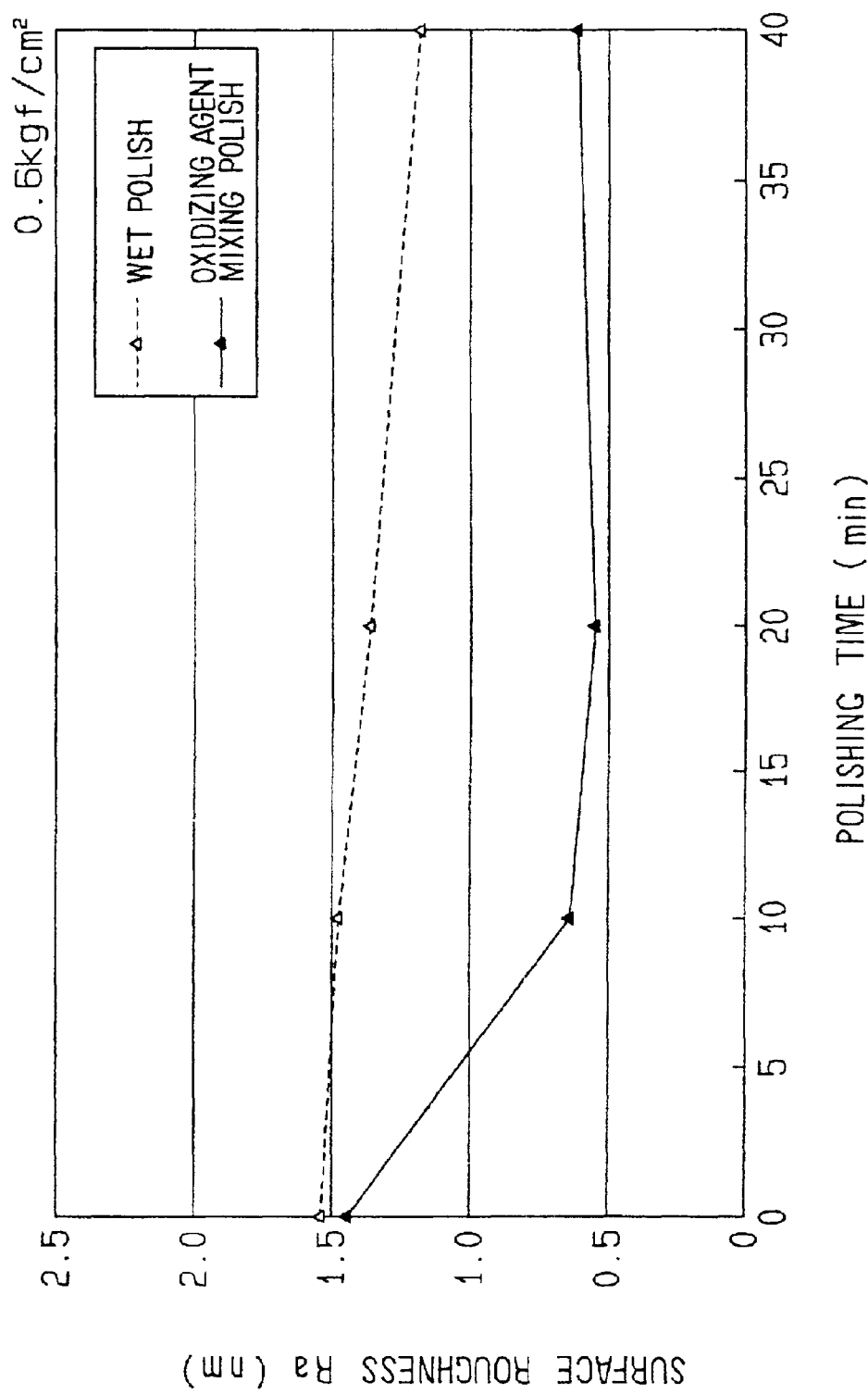
FIG. 9 is a graph showing surface roughness relative to polishing time.

Further, a similar experiment was conducted with a reduced processing pressure (polishing was performed under the same conditions as described above except the processing pressure). Specifically, wet polishing (in which chromium oxide abrasive grains of 10% by weight were dispersed in water) and polishing with the oxidizing agent (in which chromium oxide abrasive grains of 10% by weight were dispersed in hydrogen peroxide water (10%)) were performed with the pressure reduced from 3.0 kgf/cm² to 0.6 kgf/cm². FIG. 9 shows results of the experiment (changes in surface roughness).

A comparison between FIG. 9 and FIG. 8 described above indicates that, when the processing pressure is reduced, the wet polishing (wet polish) and the polishing with the oxidizing agent (oxidizing agent mixing polish) significantly differ from each other in polishing efficiency depending on whether hydrogen peroxide is present or not. For example, comparing those modes of polishing for 40 minutes, in the case of wet polishing, the experiment under the processing pressure of 3.0 kgf/cm² (FIG. 8) and the experiment under the processing pressure of 0.6 kgf/cm² (FIG. 9) resulted in Ra≈0.6 nm and Ra≈1.2 nm respectively. Meanwhile, the polishing with the oxidizing agent resulted in Ra≈0.6 nm in FIG. 8 and Ra≈0.6 nm also in FIG. 9. This indicates that the polishing efficiency of wet polishing (involving dispersion in water) significantly deteriorates when the processing pressure is decreased, and that the reduction in polishing efficiency is small for polishing in which hydrogen peroxide is mixed as an oxidizing agent.

Although no data is shown, as a result of an experiment conducted with a still lower processing pressure (0.34 kgf/cm²) under the condition that the oxidizing agent was mixed, polishing for 30 minutes reduced surface roughness Ra from 1.20 nm to 0.43 mm. It is apparent from the above facts that the mixing of hydrogen peroxide as an oxidizing agent suppresses a reduction of polishing efficiency even under a low processing pressure.

The above discussion and results of experiments indicate that a SiC wafer can be easily and efficiently polished under a low processing pressure, when the polishing is performed using chromium oxide ($Cr_2O_3$) as abrasive grains, by mixing the chromium oxide abrasive grains with an oxidizing agent. The processing pressure for polishing the wafer is more preferably in the range of 0.0098 to 0.294 MPa (in the range of 0.1 to 3.0 kgf/cm²).

When the amount of chromium oxide is kept unchanged, polishing efficiency and hence surface roughness is improved as the size of the chromium oxide abrasive grains becomes small because the surface area of the grains increases. Therefore, a preferable abrasive grain size is 5 μm or less.

The following embodiments are possible as an example of an application of the present embodiment described above.

Figure 10:
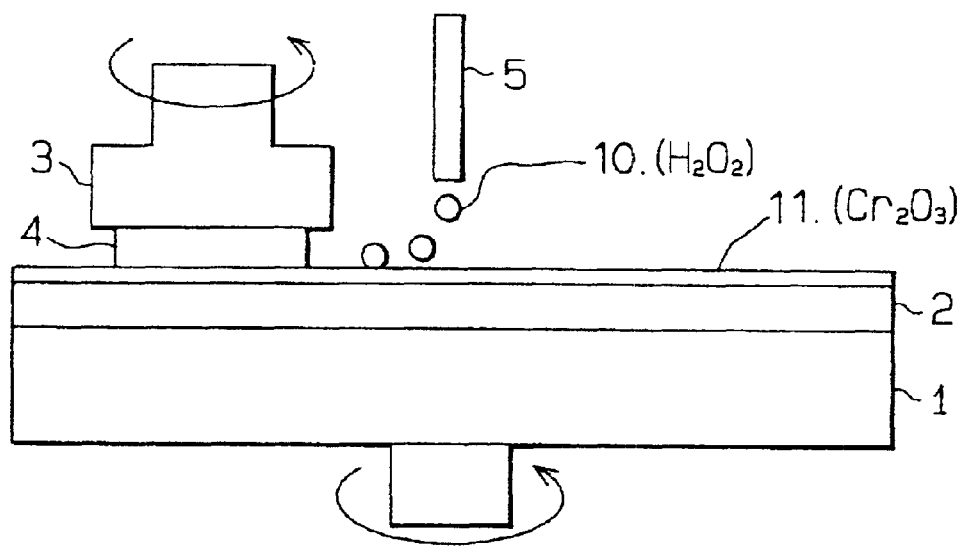
FIGS. 10 to 13 are schematic views showing mechanochemical polishing apparatuses as modifications in the first embodiment.
Figure 11:
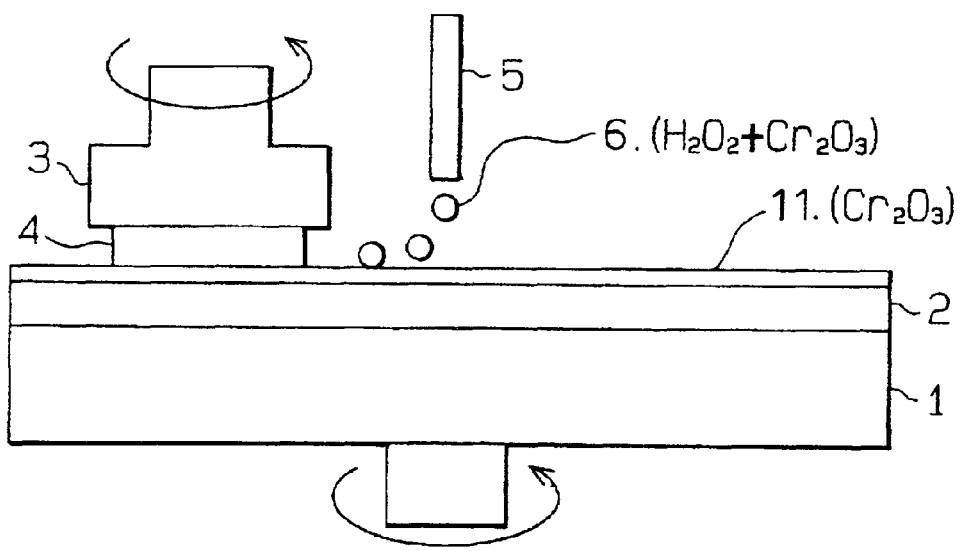

As shown in FIG. 10, similar effects can be achieved by performing polishing with a polishing cloth 2 applied with chromium oxide abrasive grains 11 on which hydrogen peroxide water (chemical liquid) 10 is dropped. Further, as shown in FIG. 11, polishing may be performed while dropping chemical liquid 6 obtained by dispersing chromium oxide abrasive grains in hydrogen peroxide water on a polishing cloth 2 to which chromium oxide abrasive grains 11 are applied. This improves polishing efficiency further because the number of abrasive grains contacting the polished surface increases.

A member made of a metal or ceramic may be used instead of a polishing cloth provided, that it can hold chromium oxide abrasive grains and an oxidizing agent. Specifically, candidates for such a metal are tin, lead, aluminum, stainless steel, copper, etc.

Figure 12:
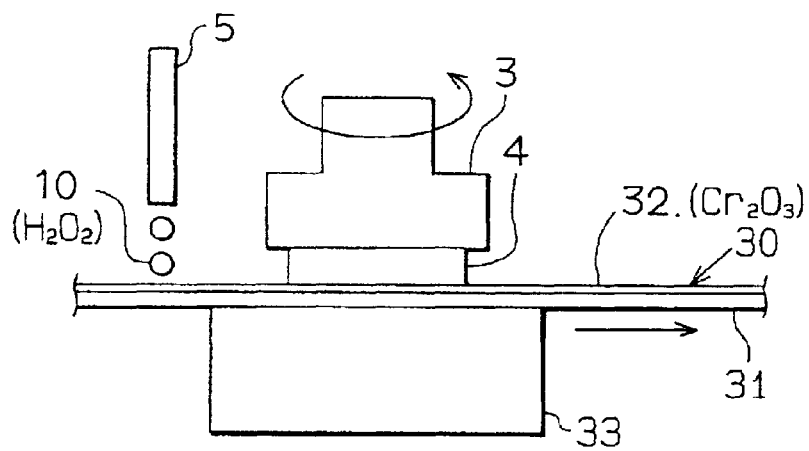

As shown in FIG. 12, the polishing cloth may be replaced with a lapping film 30, which is obtained by uniformly applying chromium oxide abrasive grains 32 on a polyester film base 31 with a resin adhesive or a disc that is obtained by fixing chromium oxide abrasive grains with resin. Fixed abrasive grains such as those on the lapping film 30 makes it possible to perform polishing with abrasive grains having a uniform grain size because there is no cohesion of the abrasive grains unlike free abrasive grains. In consideration of the lapping film 30 that is liable to be clogged, it is advantageous to remove chips resulting from polishing by spraying hydrogen peroxide water (chemical liquid) to the film 30 under a high pressure to prevent clogging.

Alternatively, when polishing is performed while dropping hydrogen peroxide water (chemical liquid) 10 on the lapping film 30 from an injector (nozzle) 5, it is advantageous in preventing clogging to employ a tape polishing method in which a SiC wafer 4 is polished with a pressure applied to the lapping film 30 while moving the lapping film 30 on a table 33 together with the film base 31 in a direction indicated by an arrow in FIG. 12.

Figure 13:
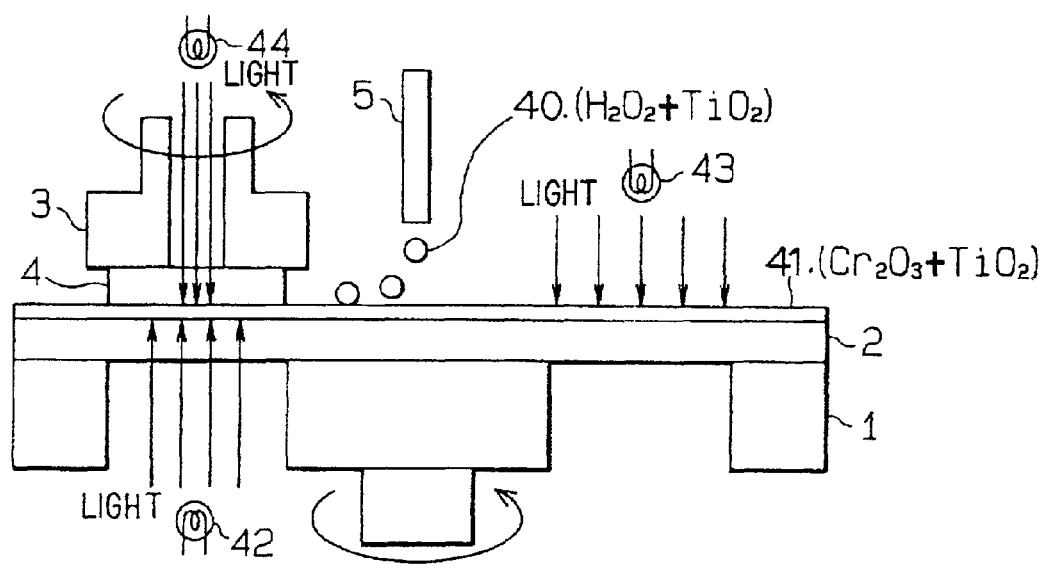

Further, as shown in FIG. 13, a surface to be polished may be supplied with chemical liquid 40 that is obtained by dispersing solid powder having a function of catalyzing a chemical reaction of oxygen and the SiC surface, other than a chromium oxide powder, specifically, titanium oxide ($TiO_2$) in the liquid that is dropped. That is, TiO2 powder is mixed in hydrogen peroxide water, and the resultant liquid is supplied to the surface to be polished from the injector 5. $TiO_2$ powder may be supplied to a surface to be polished also in second and third embodiments to be described later. As the catalyst other than a chromium oxide powder, for promoting the chemical reaction of, for example, oxygen and a SiC surface to form a reaction product on the SiC surface, titanium oxide ($TiO_2$) may be replaced with powder of cadmium sulfide (CdS), diindium trioxide ($In_2O_3$), zirconia dioxide ($ZrO_2$), dialuminum trioxide ($Al_2O_3$) or silicon dioxide ($SiO_2$).

The solid powder ($TiO_2$ powder or the like) having a function of catalyzing a chemical reaction may be applied to the polishing cloth 2 (member that moves relatively to the SiC wafer 4) to be supplied to the polished surface of the SiC wafer 4.

When such TiO2 powder or the like is used, in order to improve the catalytic function further, light sources 42, 43 and 44 may be used as shown in FIG. 13 to irradiate the powder (the $TiO_2$ powder or the like) having the function of catalyzing a chemical reaction with light. Specifically, polishing may be performed with the polishing cloth 2 that is irradiated with light using the light source 43 or may be performed to the polished surface of the SiC wafer 4 that is irradiated with light using the light sources 42 and 44.

In the present embodiment, the polishing cloth 2 is disposed on the surface of the member (polishing platen 1) that moves relatively to the SiC wafer 4, and polishing is performed with the SiC wafer 4 pressed against the polishing cloth 2, which allows the SiC wafer 4 to be polished without any damage such as scratches and cracks thereon. Then, a study was made with respect to more preferable configurations of a polishing cloth to reduce damages on the SiC wafer 4.

The above-described experiments proved that the usage of a foamed polyurethane material for a polishing cloth flattens irregularities on the surface of the wafer with high efficiency. However, some polishing cloths are likely to produce microscopic scratches and crystal distortion on the surface to be polished.

Foamed polyurethane is a hard polishing cloth that includes spherical foam cavities therein. Since the foam cavities are independent from each other, abrasive grains, chemical liquid or the like on the polishing cloth does not penetrate into the polishing cloth. It is therefore difficult to eliminate chips of a polished material that have been cut off from edges of the material and dropped on the polishing cloth. The chips are therefore likely to remain on the polishing cloth. Such chips on the polishing cloth may scratch the surface to be polished to produce scratches and crystal distortion on the surface.

Under such circumstances, it was found that the usage of a polishing cloth formed with a cavity or gap that is continuous in a direction perpendicular to the surface thereof is advantageous in preventing the generation of scratches and crystal distortion because it has improved penetrability from the surface of the polishing cloth in the direction of the depth thereof and it is soft. Since this facilitates ejection of chips of a semiconductor wafer and the like, a preferable polished surface can be formed with no scratch, crack and crystal distortion. A structure made of at least any of synthetic fibers, glass fibers, natural fibers, synthetic resin and natural resin may be used as such a polishing cloth.

More specifically, polishing cloths which are especially preferred are:

(i) suede type polishing cloths which are made of polyurethane and which have a perpendicularly foamed structure;

(ii) unwoven type polishing cloths in which complex fabric bodies are impregnated with resin which then serves as binding material between fibers or in which a resin layer itself has a continuously foamed structure; and (iii) cloths having a double-layer structure formed by combining an unwoven type cloth, as an underlying layer, in which complex fabric bodies are impregnated with resin which then serves as binding material between fibers or in which a resin layer itself has a continuously foamed structure, with a suede type cloth which is made of polyurethane and which has a perpendicularly foamed structure.

Those cloths were checked through experiments as described below.

First, when polyurethane having independent foams was used as a polishing cloth for water polishing that was performed while dropping pure water on the polishing cloth (a method which was adapted to clean a surface instead of processing the surface), scratches and crystal distortion were generated on the surface. When a polishing cloth formed with a cavity or gap continuous in a direction perpendicular to the surface was used, neither scratch nor crystal distortion was generated. This revealed that chips of a material to be polished are a cause of scratches and crystal distortion.

Further, an experiment was conducted in which polishing was performed while dropping a liquid obtained by dispersing chromium oxide abrasive grains (of 10% by weight) in hydrogen peroxide water (having a concentration of 10%) on a polyurethane polishing cloth having an independently foamed structure and on a suede type polishing cloth (Supreme RN-H manufactured by RODEL NITTA K.K.). Then, each of the surface polished using the polyurethane having independent foams and the surface polished using the suede type was etched with liquid of potassium hydroxide (KOH), and changes in those surfaces were evaluated. As a result, it was revealed that the surface became rough when the polyurethane having independent foams was used because of the presence of scratches and crystal distortion, and that the suede type did not produce scratches and crystal distortion because the surface was not roughed.

When the efficiency of a polishing process is taken into consideration, when a polishing cloth is a structure formed with independent cavities or foams on the surface and interior thereof, it is possible to flatten and smooth an irregular surface of a semiconductor wafer in a short time because the polishing cloth is hard and is excellent in retentivity of both abrasive grains and chemical liquid on the surface thereof. It is also possible to remove any process-affected layer generated at a step preceding polishing (a grinding process, a lapping process or the like) in a short time. In this case, a structure made of synthetic resin or natural resin is preferably used as the polishing cloth. A foamed polyurethane type polishing cloth having an independently foamed structure is especially preferred.

Therefore, it is preferable to use a foamed polyurethane type polishing cloth formed with independent cavities or gaps on the surface and interior thereof when the efficiency of the polishing process is essential. Besides, it is preferable to use a suede type polishing cloth formed with a cavity or gap which is continuous in a direction perpendicular to the surface if it is essential to obtain a polished surface with high quality having no scratch and crystal distortion.

Alternatively, it is possible to use a polishing cloth having a double-layer structure formed by combining a cloth which is a structure formed with a cavity or gap that is continuous in a direction perpendicular to the surface thereof as an underlying layer, and a cloth which is a structure formed with independent cavities or foams on the surface and interior thereof. In this case, the structure on the surface (the cloth contacting a wafer) provides an excellent polishing speed and flattening efficiency, and the structure of the underlying layer (the underlying cloth) improves compliance to swells and warps of the semiconductor wafer. Accordingly, the wafer can be polished with high accuracy.

An especially preferable polishing cloth is a polishing cloth having a double-layer structure including an unwoven type polishing cloth as an underlying layer in which complex fabric bodies are impregnated with resin which then serves as binding material between fibers or in which a resin layer itself has a continuously foamed structure, and a foamed polyurethane type cloth having an independently foamed structure bonded with the underlying layer.

(Second Embodiment)

A second embodiment of the invention will now be described with differences from the first embodiment in the focus of discussion.

Figure 14:
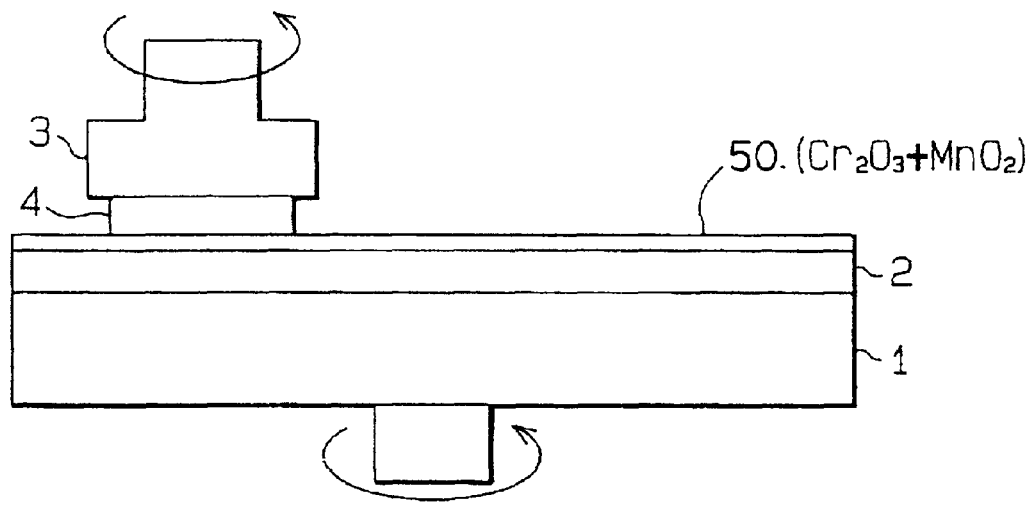
FIGS. 14 and 15 are schematic views showing mechanochemical polishing apparatuses in a second preferred embodiment of the invention.

FIG. 14 is a schematic configuration diagram showing a mechanochemical polishing apparatus according to the second embodiment. This apparatus uses a mixture of chromium oxide and solid powder, specifically, powder of manganese dioxide ($MnO_2$), having an oxidizing function, which is applied as abrasive grains 50 to a polishing cloth 2 (a member that moves relative to a SiC wafer 4). Accordingly, the mixture including the powder as an oxidizing agent is supplied to the surface of the SiC wafer 4 to be polished.

Referring to steps for polishing, the SiC wafer 4 is polished with chromium oxide abrasive grains and the powder of manganese dioxide applied to the polishing cloth 2 as abrasive grains 50. Since manganese dioxide has an oxidizing function, it reacts with SiC to form an oxide on the surface of SiC. Chromium oxide abrasive grains promote the oxidation as a catalyst and serve as polishing abrasive grains for removing the oxide thus formed. This improves polishing efficiency and makes it possible to perform polishing even with a low processing pressure.

The present embodiment may be modified as follows.

Figure 15:
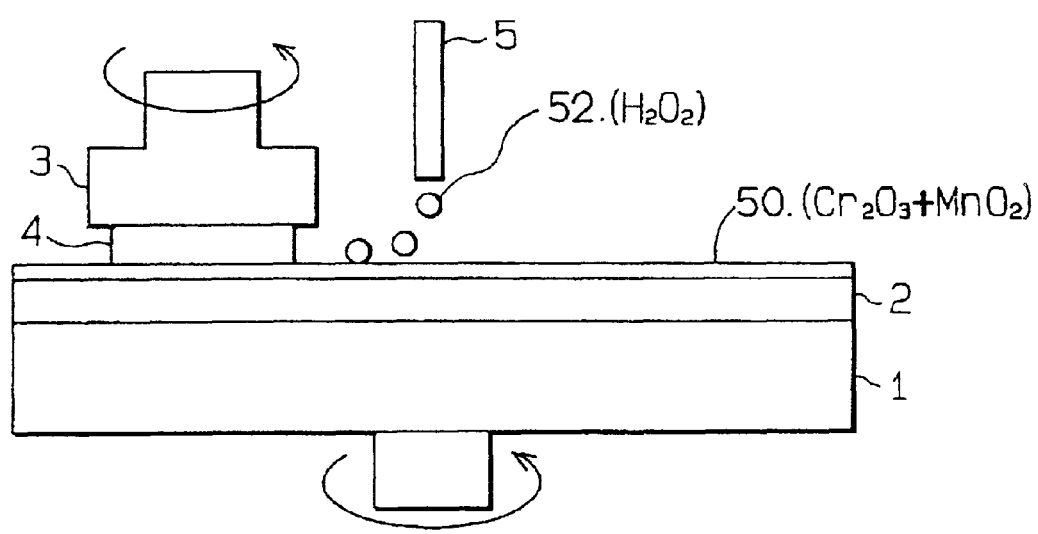

As shown in FIG. 15, hydrogen peroxide water (chemical liquid) 52 may be dropped on the polishing cloth 2 from an injector 5 when chromium oxide abrasive grains and powder of manganese dioxide is applied to the polishing cloth 2 as the abrasive grains 50. This makes it possible to improve oxidizing efficiency (polishing efficiency). In this case, manganese dioxide and hydrogen peroxide reacts with each other to produce oxygen, which improves efficiency further. Hydrogen peroxide water including chromium oxide abrasive grains dispersed therein may be used as the chemical liquid 52.

Referring to FIG. 15, liquid obtained by dispersing the powder of manganese dioxide in a dispersing medium (e.g., water) may be used as the chemical liquid 52. That is, the solid state powder ($MnO_2$) having an oxidizing function may be supplied to the surface of the wafer 4 to be polished by dispersing it in a droplet. As the powder having an oxidizing function, it is possible to use powder of dimanganese trioxide ($Mn_2O_3$) or a mixture of powder of $MnO_2$ and powder of $Mn_2O_3$, in addition to powder of manganese dioxide ($MnO_2$).

When a lapping film (see FIG. 12) is used, a solid powder having an oxidizing function may be applied to the film on which chromium oxide abrasive grains are fixed, and otherwise, a mixture of chromium oxide abrasive grains and solid powder having an oxidizing function may be fixed on a film. The solid powder having an oxidizing function used in this case may be $MnO_2$, $Mn_2O_3$, $BaCO_3$, $CaCO_3$, $SiO_2$, $Fe_2O_3$, $Fe_3O_4$, MgO, $In_2O_3$ or the like.

(Third Embodiment)

A third embodiment of the invention will now be described with differences from the first embodiment in the focus of discussion.

Figure 16:
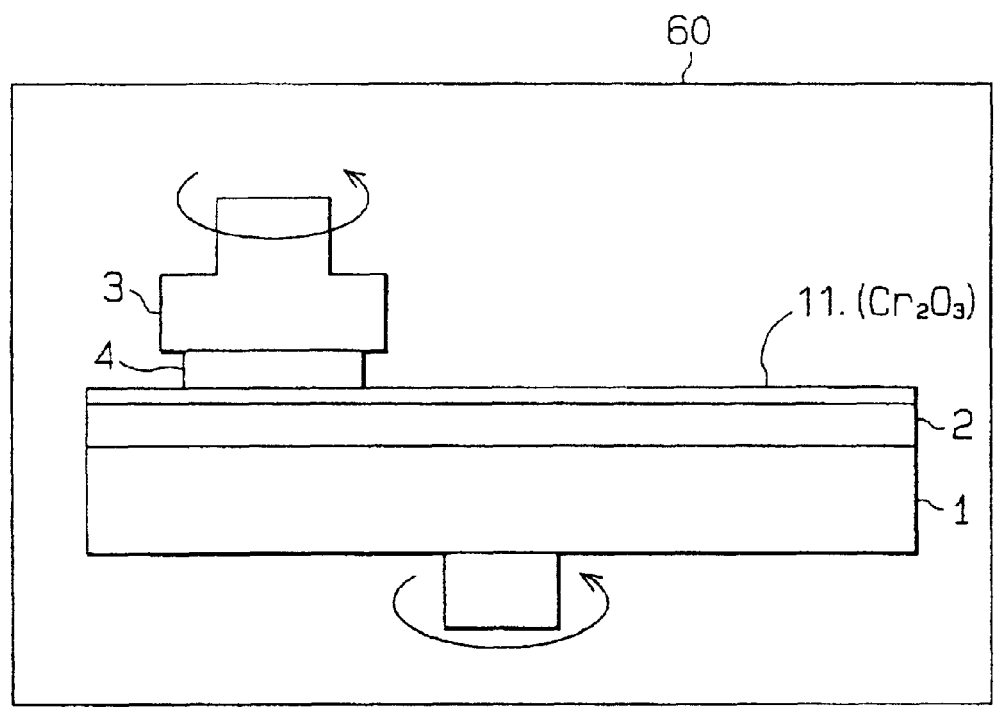
FIGS. 16 to 21 are schematic views showing mechanochemical polishing apparatuses in a third preferred embodiment of the invention.

In the present embodiment, gas including at least oxygen, specifically, oxygen gas is used as an oxidizing agent. As shown in FIG. 16, an apparatus having a structure like a hermetically sealed vessel is employed to keep a surface to be polished in an oxidizing gaseous atmosphere. Specifically, a polishing platen 1, a polishing cloth 2 and a wafer holding table 3 are provided in an oxygen atmosphere generating chamber 60. Oxygen atmosphere is maintained in the chamber 60, and polishing is performed in the oxygen atmosphere while supplying oxygen gas to the surface to be polished.

Referring to steps for polishing, oxygen atmosphere is generated in the chamber 60 after setting a SiC wafer 4 on the wafer holding table 3. Polishing is then performed in the oxygen atmosphere. That is, the SiC wafer 4 is polished on the polishing cloth 2 on which chromium oxide abrasive grains 11 are applied. At this time, oxygen is supplied to the contact surface between the SiC wafer 4 and the polishing cloth 2.

Figure 17:
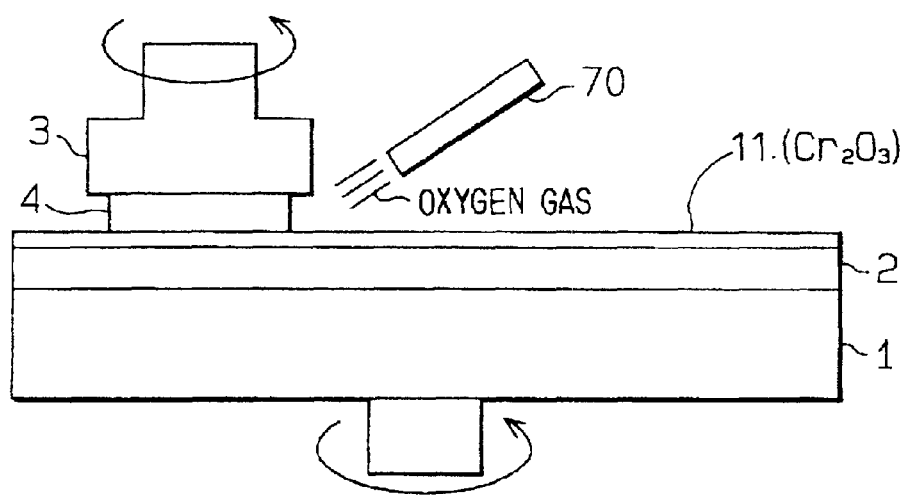

Instead of using the apparatus shown in FIG. 16, as shown in FIG. 17, oxygen gas may be blown from a gas injector 70 toward a part to be polished (polished surface) to be supplied to the polished surface. Specifically, oxygen gas is blown from the gas injector 70 toward the polishing cloth 2 (a part of the polishing cloth 2 located at an upstream side of the SiC wafer 4) immediately before the polishing cloth 2 is put into contact with the SiC wafer 4.

Figure 18:
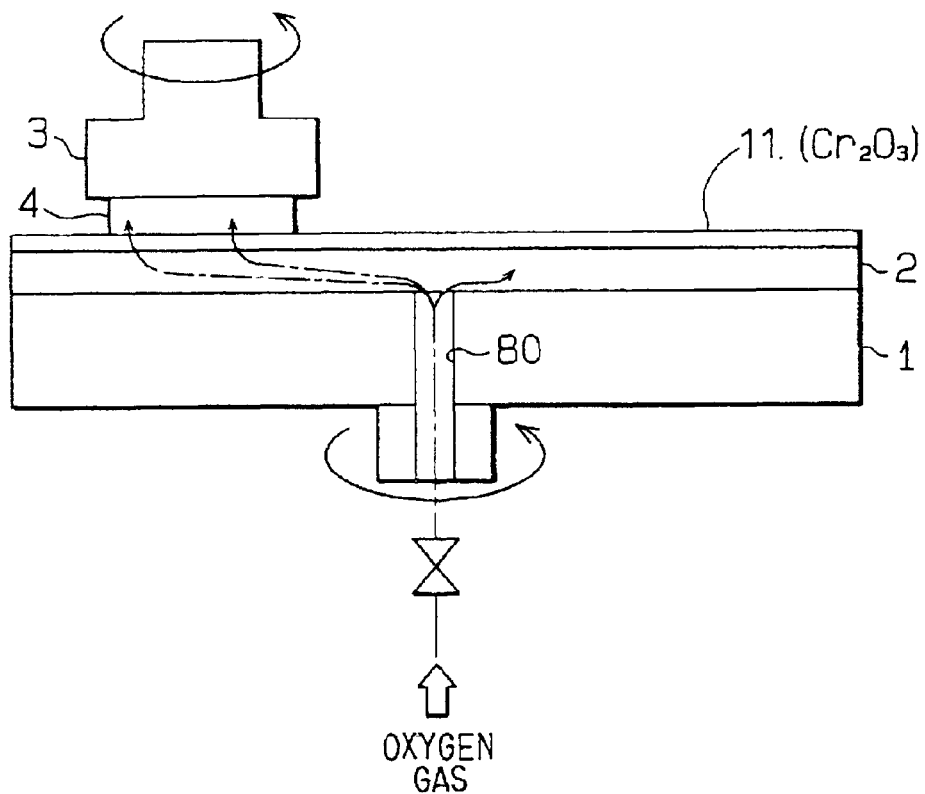

Further, instead of the apparatus shown in FIG. 16, an oxygen gas supply channel 80 is provided in the polishing platen 1 as shown in FIG. 18. Specifically, the gas channel 80 supplies oxidizing gas to the surface to be polished through a member that moves relative to the SiC wafer 4. Oxygen gas is blown from the bottom side of the polishing cloth 2 (the side of the member that moves relative to the SiC wafer 4) through the channel 80 toward the part of the surface of the polishing cloth 2 for performing polishing.

In this case, a cloth having microscopic holes to allow passage of the gas is chosen as the polishing cloth 2. For example, the polishing cloth 2 can be made of polyurethane having independent foams. In this case, the polishing cloth 2 would have holes penetrating from the top to the bottom thereof if the foamed portion is large enough. The polishing cloth 2 can also be made of unwoven fibers having continuous foams allowing oxygen to pass therethrough. The supplied gas is not limited to oxygen gas, but may be other gases such as water vapor provided that it includes at least oxygen.

Figure 19:
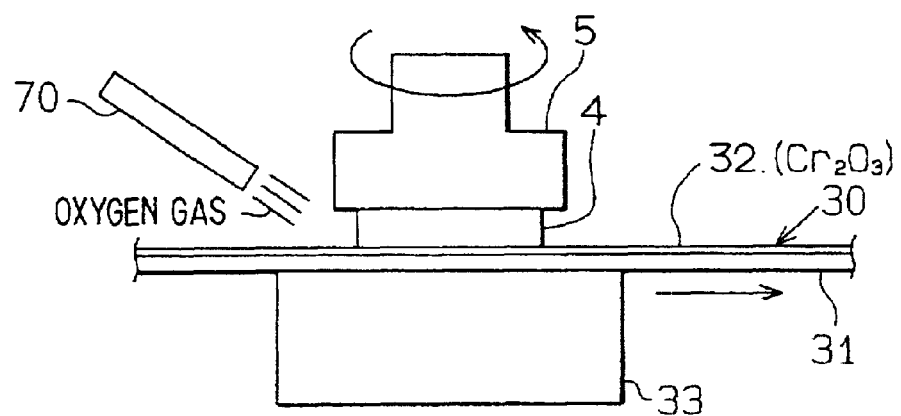

As shown FIG. 19, when the SiC wafer 4 is polished on the lapping film 30 that is provided by uniformly applying chromium oxide particles 32 on the film base 31 with resin adhesive, it is possible to prevent clogging more reliably by blowing oxygen gas (in a broad sense, gas including oxygen) from the gas injector 70.

Figure 20:
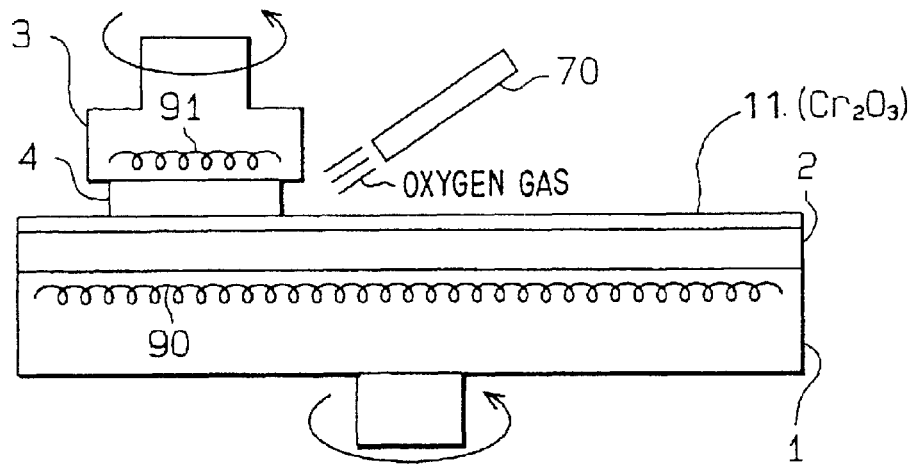
Figure 21:
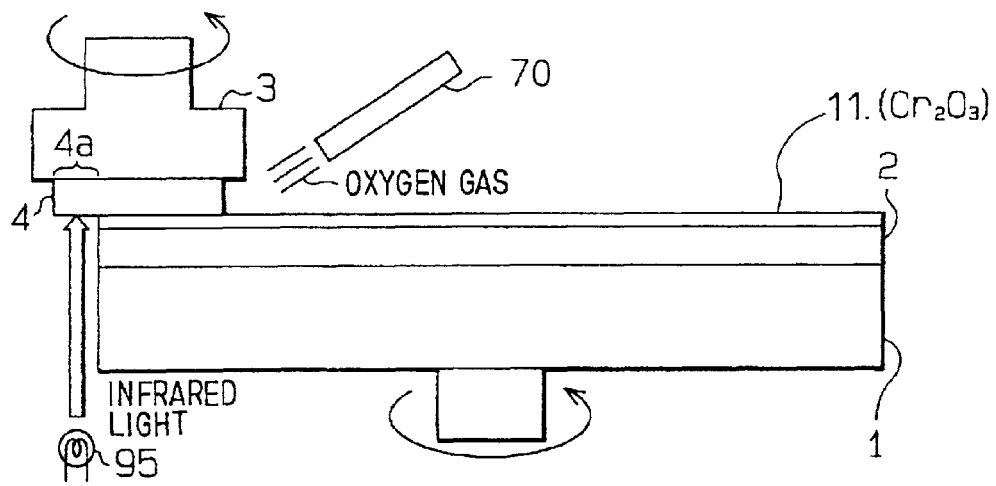
Figure 22:
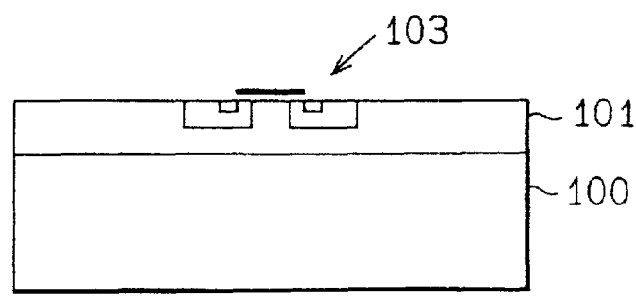
FIG. 22 is a cross-sectional view showing a semiconductor device as a related art.

As shown in FIG. 20, the SiC wafer 4 may be polished while being heated to promote a reaction (to improve polishing efficiency). In FIG. 20, the SiC wafer 4 is heated by heaters 90 and 91. Otherwise, as shown in FIG. 21, the SiC wafer 4 may be polished with a part of the same protruding from an edge of the polishing cloth 2 (polishing platen 1), and heating may be performed by irradiating the protruding region 4a with infrared light from a light source 95. At this time, the table 3 (SiC wafer 4) is preferably swung.

Thus, the heating means 90, 91 and 95 for heating at least a part of the surface to be polished may be provided. They are also implemented in the above-described embodiments. Further, polishing efficiency may be improved by heating the polishing cloth which holds chromium oxide abrasive grains and an oxidizing agent, the lapping film to which metal, ceramic or chromium oxide particles are applied or the disc obtained by fixing chromium oxide abrasive grains with resin.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A method for mechanochemical polishing, comprising:

preparing a chemical solution that includes hydrogen peroxide water and abrasive grains made of chromium (III) oxide;

polishing a surface of a SiC wafer by mechanochemical polishing to remove SiC from the surface of the wafer using the chemical solution and a polishing cloth with a processing pressure having a range of approximately 0.1–3.0 kgf/cm$^2$; and increasing oxygen concentration on the surface of the SiC wafer to promote the formation of an oxide of the SiC wafer by performing the polishing in the presence of the hydrogen peroxide water, wherein the oxide of the SiC wafer is formed by catalysis of the chromium (III) oxide, and the oxygen concentration around the polishing surface of the SiC wafer is increased by supplying the hydrogen peroxide water to the polishing surface to promote the formation of the oxide of the SiC wafer.

2. The method according to claim 1, wherein the method further includes coating the cloth with grains of manganese dioxide.

3. The method according to claim 1, wherein the method includes dropping the chemical solution onto the polishing cloth on the surface of the SiC wafer.

4. The method according to claim 1, wherein the method includes adding a solid powder oxidizing agent to the chemical solution.

5. The method according to claim 4, wherein the solid powder includes at least one of manganese dioxide and dimanganese trioxide.

6. The method according to claim 4, wherein the method includes polishing the surface of the semiconductor wafer on a member that moves relatively to the semiconductor wafer, wherein the solid powder is located on the member.

7. The method according to claim 4, wherein the method includes dropping the chemical solution, in which the solid powder is dispersed, onto the surface of the SiC wafer.

8. The method according to claim 1, wherein the method includes supplying a solid powder made of a material other than chromium (III) oxide to the surface of the semiconductor wafer when the surface is polished, wherein the material catalyzes a chemical reaction.

9. The method according to claim 8, wherein the method includes dispersing the solid powder in a liquid and dropping the liquid and the powder on the surface of the semiconductor wafer.

10. The method according to claim 8, wherein the method includes placing the solid powder on a member that is moved relatively to and contacts the surface of the SiC wafer when the surface is polished.

11. The method according to claim 8, wherein the solid powder contains at least one of titanium dioxide, cadmium sulfide, and diindium trioxide.

12. The method according to claim 8, wherein the method includes irradiating the solid powder with light when the surface of the semiconductor wafer is polished.

13. The method according to claim 1, wherein the method includes heating the surface of the semiconductor wafer during the polishing.

14. The method according to claim 1, wherein the polishing cloth is comprised of suede.

15. The method according to claim 1, further comprising increasing the oxygen concentration reacting with the SiC wafer during the increasing of the oxygen concentration on the surface of the SiC wafer.

16. The method according to claim 1, wherein the abrasive gains have a gain size of 5 µm or less.

17. The method according to claim 1, wherein the polishing is performed for 10 minutes or more when the processing pressure is in a range of 0.6–3.0 kgf/cm$^2$.

* * * * *